United States Patent [19]

Heller

[11] 4,047,051

[45] *Sept. 6, 1977

[54] METHOD AND APPARATUS FOR REPLICATING A CHARGE PACKET

[75] Inventor: Lawrence Griffith Heller, Brewster, N.Y.

[73] Assignee: International Business Machines Corporation, Armonk, N.Y.

[*] Notice: The portion of the term of this patent subsequent to Aug. 23, 1994, has been disclaimed.

[21] Appl. No.: 625,425

[22] Filed: Oct. 24, 1975

[51] Int. Cl.$^2$ ............ G11C 19/28; H01L 29/78
[52] U.S. Cl. .................. 307/221 D; 357/24
[58] Field of Search ............ 357/24; 307/221 D, 304

[56] References Cited

U.S. PATENT DOCUMENTS

| | | | |
|---|---|---|---|
| 3,623,132 | 11/1971 | Green | 357/24 |
| 3,760,202 | 9/1973 | Kosonocky | 357/24 |
| 3,806,772 | 4/1974 | Early | 357/24 |
| 3,838,438 | 9/1974 | Silversmith | 357/24 |
| 3,937,985 | 2/1976 | Cooper | 307/304 |

OTHER PUBLICATIONS

Heller et al. "Potential Well Single-Device Charge Amplifier and Inverter" IBM Tech. Disclosure Bulletin vol. 14 (Sept. 1971) pp. 1193-1194.
Tompsett "A Simple Charge Regenerator for Use with Charge-Transfer Devices and the Design of Functional Logic Arrays" IEEE J. Solid-State Circuits vol. SC-7 (June 1972) pp. 237-242.

Primary Examiner—William D. Larkins
Assistant Examiner—Gene M. Munson
Attorney, Agent, or Firm—John J. Goodwin

[57] ABSTRACT

A method and apparatus for duplicating or replicating an original packet of charge carriers such as electrons or holes while leaving the original charge packet unchanged and still available for further processing is described. A charge-coupled device (CCD) circuit is provided using gate displacement charge flow in combination with a bucket brigade circuit. The CCD circuit includes a first +CCD well, a source diffusion and a second CCD well. An original charge packet is introduced into the first CCD well, the gate of which being precharged to a given source potential. The charge packet in the first CCD well reduces the magnitude of the source potential and it is immediately restored by current flow which in turn causes charge carriers to transfer from the source diffusion into the second CCD well until a charge packet is contained in the second CCD well which is a replica of the original charge packet.

3 Claims, 4 Drawing Figures

METHOD AND APPARATUS FOR REPLICATING A CHARGE PACKET

BACKGROUND OF THE INVENTION

1. Field of the Invention

The present invention relates to a method and apparatus for charge packet replication or duplication, and more particularly to a charge packet replication circuit employing gate displacement charge flow in combination with a bucket brigade circuit.

2. Description of the Prior Art

Charge-coupled device technology has been known heretofore for signal processing. The shifting of charge from one storage well to another, and the adding of increments of charge to preexisting packets of charge for amplification are known techniques, as illustrated in U.S. Pat. No. 3,806,772, entitled *Charge Coupled Amplifier*, issued to James M. Early on Apr. 23, 1974 on an application filed Feb. 7, 1972 and assigned to Fairchild Camera and Instrument Corporation. The present invention teaches the novel concept of duplicating packets of charge to be used for signal processing while leaving the original charge packets unchanged.

SUMMARY OF THE INVENTION

It is the primary object of the present invention to provide a method and circuit structure for duplicating a quantity or packet of charge carriers.

Another object of the present invention is to provide a method and circuit apparatus wherein an original packet of charge carriers is duplicated or replicated to provide a second packet of charge carriers without changing the original packet.

Still another object of the present invention is to provide means for duplicating or replicating a packet of charge carriers employing a bucket brigade circuit.

A further object of the present invention is to provide means for duplicating a packet of charge carriers employing a charge coupled device circuit using gate displacement charge flow in combination with a bucket brigade circuit.

The foregoing and other objects, features and advantages of the invention will be apparent from the following more particular description of the preferred embodiments of the invention as illustrated in the accompanying drawings.

DESCRIPTION OF THE PREFERRED EMBODIMENT

Figure 1:
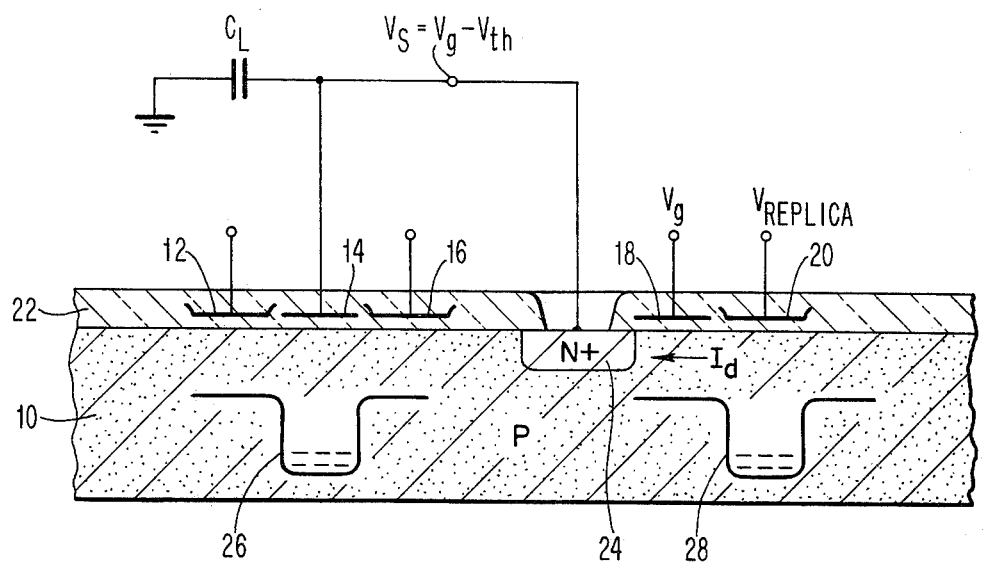
FIG. 1 is a schematic diagram of a cross-section of an embodiment of a charge coupled device circuit for charge packet replication following the principles of the present invention.

FIG. 1 is a schematic illustration of a cross-section of a charge coupled device structure including a p-type substrate 10 which may be composed of silicon. Electrodes 12, 14, 16, 18 and 20 are embedded in an insulation layer 22 of which may be composed of silicon dioxide. Electrodes 12, 14, 16, 18 and 20 may be composed of aluminum or other suitable material. An N+ source region 24 is formed in substrate 10 and is connected to electrode 14. A capacitance $C_L$ is shown connected to source region 24 and represents the parasitic capacitance. Electrode 18 is connected to a gate potential $V_g$ and electrode 20 is connected to a potential referred to as Vreplica. The phase 1 signal and the other control signals applied to the designated electrodes are obtained from a system clock in a conventional manner and therefore the clocking means is not shown or described in detail but can be understood from the timing diagram. Initially the circuit of FIG. 1 is precharged to a value such that electrode 14 is at a source potential $V_s$ equal to $V_g - V_{th}$ where $V_{th}$ is the threshold voltage for source diffusion region 24 and the precharge charge is removed from under the Vreplica electrode. Electrode 12 is a control electrode which permits a given quantity or packet of charge, which will be referred to as Qoriginal, to be transferred into a first CCD input well, depicted at 26.

When the charge packet Qoriginal is transferred into the first well it tends to pull electrode 14 down or lower $V_s$. This in turn causes a recharge current $I_d$ to flow and restore $V_s$ back to the value $V_g - V_{th}$. When the $I_d$ current flows, charge is transferred from source diffusion 24 into a second CCD well 28 under electrode 20. The amount of quantity of charge referred to as Qreplica, that is transferred into the second CCD well 28 is essentially equal to the amount of charge in the input charge packet Qoriginal. The charge packet Qreplica that accumulates in well 28 can be calculated from the oxide capacitance of the circuit.

Figure 2:
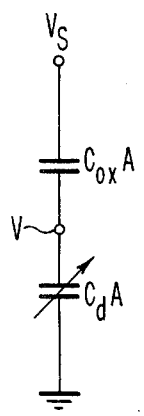
FIG. 2 is a schematic illustration of an equivalent circuit of a portion of the structure of FIG. 1.

Referring to FIG. 2, the equivalent circuit for the first CCD well 26 is illustrated and includes a surface-to-gate oxide capacitance $C_{ox}$ and a depletion capacitance $C_d$ disposed between the silicon surface and ground, where the depletion capacitance is a non-linear value dependent on voltage. If A is the effective area of the charge packet Qoriginal, the capacitance of the potential well 26 is a $C_{ox}A$ in parallel with $C_dA$ and the change in surface potential $\Delta V$ due to the input charge packet is as follows $$\Delta V = Q\text{original} /A \cdot (C_{ox} + C_d)$$

and since the charge that is transferred, Qreplica is equal to $A \cdot C_{ox} \cdot \Delta V$ then $$Q\text{replica} = Q\text{original} \cdot C_{ox}/(C_{ox} + C_d).$$

Since $C_d$ does not change rapidly with Qoriginal and $C_{ox}$ is substantially greater than $C_d$ then Qreplica is substantially equal to Qoriginal.

Thus it has been shown that the circuit of FIG. 1 functions to create a replica charge packet of an original input charge packet using bucket brigade techniques in a CCD technology embodiment. The charge packet now available in CCD well 28 may be used for signal processing and the like while the original input charge packet in CCD well 26 remains unchanged.

Figure 3:
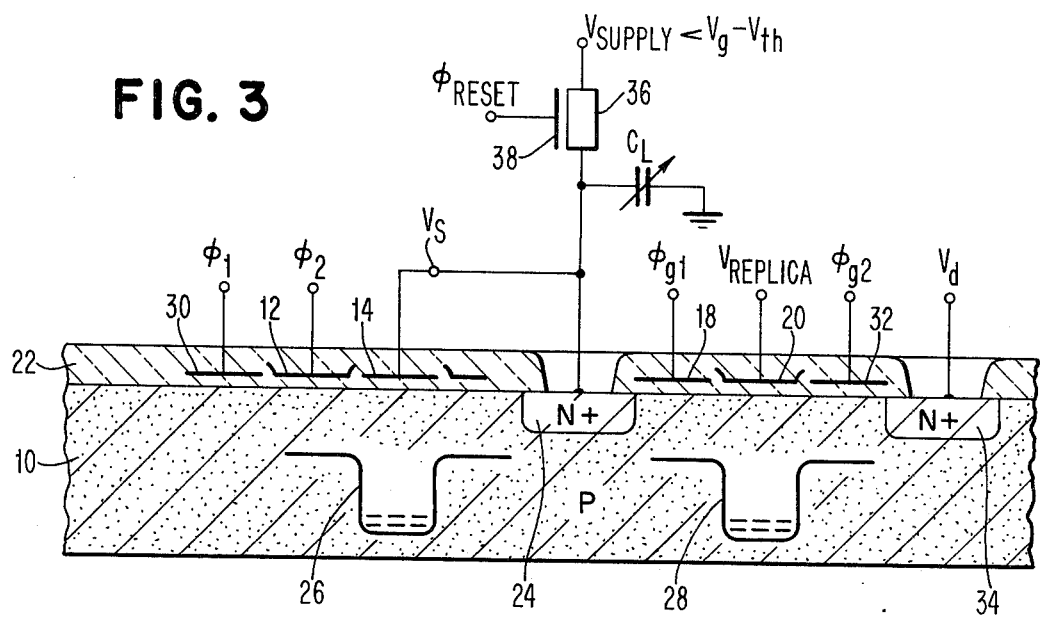
FIG. 3 is a schematic illustration of a cross-section of an embodiment of the charge coupled device of FIG. 1 including support circuitry therefor.
Figure 4:
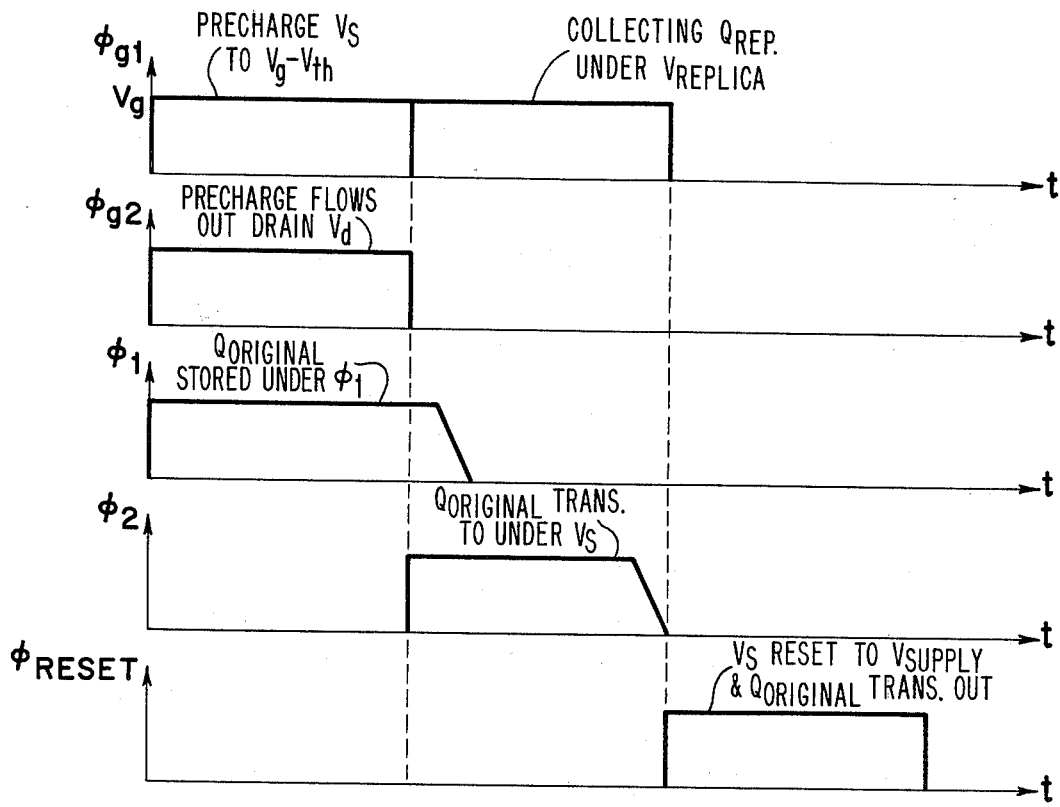
FIG. 4 is an illustration of a timing diagram useful in explaining the operation of the circuit of FIG. 1.

Referring to FIG. 3, an illustration of an embodiment of the present invention is shown including additional support circuitry which contributes to the operation of the invention. FIG. 4 is provided to illustrate the timing sequence of the operation of the circuit of FIG. 3. In FIG. 3 an electrode 30 is connected to a source of phase 1 signal and electrode 12 is connected to a source of phase 2 signal. Electrode 18 is connected to a phase g1 gate signal and an electrode 32 is connected to a source of phase g2 gate signal. A diffusion region 34 is connected to a signal drain $V_d$ and an active device 36 is connected to diffusion source region 24 and is controlled by a reset signal on lead 38.

In operation, a phase 1 signal occurs which is applied to electrode 30 causing the input charge packet Qoriginal to be transferred and stored under electrode 30. At the same time the phase g1 gate signal occurs and is applied to electrode 18 producing a precharge condition $V_s$ on electrode 14 to the value $V_s = V_g - V_{th}$ as previously discussed. Also at this time the phase g2 gate signal occurs and is applied to electrode 32 such that precharge flows out of drain $V_d$. $V_d$ is used to drain off the charge associated with the precharge so it does not mix with Qreplica.

After the preceding has taken place, a phase 2 signal occurs and is applied to electrode 12, thereby transferring Qoriginal into CCD well 26 under electrode 14 which has been charged to $V_s = V_g - V_{th}$. At this time, as previously discussed, $V_s$ tends to decrease in magnitude and current $$I_d = \frac{\beta}{2}(V_{gs} - V_{th})^2$$

flows to maintain $V_s$ equal to $V_g - V_{th}$. The expression for $I_d$ is the well known equation for the MOSFET saturation characteristic used in bucket brigade circuits. As a result the Qreplica charge packet begins to collect in CCD well 28 under electrode 20. When Qreplica in CCD well 28 is substantially equal to Qoriginal in CCD well 26 the desired result has been obtained, after which the cycle can be repeated by applying a reset signal to active device 36. The reset function supplies charge (electrons in the present example) before the precharge function so that $V_s$ can be charged up to equal $V_g - V_{th}$.

The preceding discussion was directed to an embodiment wherein the charge carriers in the charge packets are electrons. It should be understood by one skilled in the art that the charge carriers in the packets could be holes, and the circuit of FIGS. 1 and 3 would merely be modified to have compatible polarity, for example, source region 24 would be P+.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A circuit for entering quantities of electrical charge carriers into a first charge storage well of a solid-state charge-transfer-device of the type having a semiconductor substrate and a plurality of charge transfer means for moving quantities of electrical charge carriers in a controlled manner across said substrate, said circuit comprising:

a source diffusion means located on said semiconductor substrate and producing an inherent depletion capacitance $C_d$, an input lead connected to said source diffusion means, an active device connected between a supply voltage and said input lead, said active device being controlled by a source of reset signal to couple said supply voltage to said source diffusion to raise the potential of said source diffusion to equal a predetermined first precharge potential, a second charge storage well containing a quantity of original charge Q for providing a voltage $\Delta V$ which is applied and coupled to said input lead to vary the potential of said source diffusion for producing and inserting into said first charge storage well of said charge-transfer-device a quantity of charge carriers Q directly proportional to said voltage $\Delta V$ and independent of said depletion capacitance $C_d$, and an electrical charge drain means located on said semiconductor substrate to remove charge carriers produced by said diffusion when said source diffusion is equal to said predetermined first precharge potential.

2. An input circuit according to claim 1 wherein said charge-transfer-device further includes an input gate proximate to said source diffusion which is operated by a gate signal $\phi g_1$ having an amplitude $V_g$ and which forms with said source diffusion an insulated gate input diode which has a threshold potential $V_{th}$.

3. An input circuit according to claim 2 wherein said source diffusion is precharged to a potential of $V_S = V_g - V_{th}$ by charge carrier flow from said source diffusion and wherein excess charge carriers produced by said source diffusion are removed by said electrical charge drain means such that no inversion charge exists in the input circuit.

* * * * *